United States Patent
Yu et al.

(10) Patent No.: US 6,632,314 B1
(45) Date of Patent: Oct. 14, 2003

(54) METHOD OF MAKING A LAMINATION AND SURFACE PLANARIZATION FOR MULTILAYER THIN FILM INTERCONNECT

(75) Inventors: RongQing Yu, Poughkeepsie, NY (US); Kimberley A. Kelly, Pleasant Valley, NY (US); Chandrika Prasad, Wappingers Falls, NY (US); Sung Kwon Kang, Chappaqua, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/474,189

(22) Filed: Dec. 29, 1999

(51) Int. Cl.$^7$ ................................................ B32R 31/00
(52) U.S. Cl. .................... 156/241; 156/247; 156/331.5; 156/344
(58) Field of Search ............................... 156/74, 331.5, 156/323, 241, 247, 344; 29/829

(56) References Cited

U.S. PATENT DOCUMENTS

| | | | | |
|---|---|---|---|---|
| 3,416,994 A | * | 12/1968 | Chalmers et al. | 156/331.5 |
| 4,246,054 A | * | 1/1981 | Nester | 156/74 |
| 4,543,295 A | * | 9/1985 | St. Clair et al. | 156/331.5 |
| 4,653,175 A | * | 3/1987 | Brueggeman et al. | 156/241 |
| 5,199,163 A | * | 4/1993 | Ehrenberg et al. | 29/830 |
| 5,261,977 A | * | 11/1993 | Powell | 156/74 |
| 6,281,452 B1 | * | 8/2001 | Prasad et al. | 174/262 |

* cited by examiner

Primary Examiner—Michael W. Ball
Assistant Examiner—John T. Haran (57) ABSTRACT

A method of making a surface planarization is provided using a separate pre-cut or precured film laminated onto a metallized surface to form planarized dielectric coating. The method comprises the steps of: (a) providing a thin film interconnect module with a polyimide adhesive laminated with a pre-cut or pre-cured polyimide lamination film on the top of the polyimide adhesive, the polyimide lamination film being covered with a glass plate; (b) applying pressure and heat in a synchronized format to ensure a uniform curing and gap filling in the thin film module metal for the adhesive layer; and (c) releasing the glass plate to expose a smooth lamination film surface.

11 Claims, 6 Drawing Sheets

METHOD OF MAKING A LAMINATION AND SURFACE PLANARIZATION FOR MULTILAYER THIN FILM INTERCONNECT

FIELD OF INVENTION

The invention relates to a process for, lanarizing dielectric layers in at multi-level thin film structures and the equipment that accomplishes the same.

BACKGROUND OF THE INVENTION

Thin film interconnect has been the standard for high performance multi-chip module (MCM) packaging. As a chip IO (input-output) density in an MCM module increases, the layers of thin films to interconnect among the chips and those between chip IO and peripherals increase as well. Due to metal loading distribution in wiring design, the top surface topography of thin films increases as the number of layers increases. For a typical one plane pair (x and y wiring) with power and ground mesh design (6 levels thin film) the average thin film thickness is in the range of 50 microns (approx. 2 mils). The top surface topography in such a thin film structure can vary as much as 15–20 microns ($\mu$m). This is close to 40% surface topography variation. To date this level of surface topography is acceptable for MCM C4 (controlled-collapse-chipconnection) joining at 4 on 9 mil pitch. However, as the C4 pitches approach 6, 5, 4, 3 and 2 mils in the future and when more than one plane pair of thin films are required for chip interconnect, the surface topography needs to be minimized reaching to 5 $\mu$m or less eventually. This requires that top surface be planarized by some suitable technique. The most straight forward approach for such planarization is to use top surface polish after each layer of dielectric coating is built on metal level. However, polishing process is expensive. In addition, polishing is difficult to extend to large format (e.g., greater than 300 mm dia.) thin film processing because the large format thin film processing carrier itself has surface variation as well as rigidity flexing, which could reach 25$\mu$m or more. These factors make dielectric polish difficult to accomplish in a large size scale.

U.S. Pat. No. 5,336,353 describes methods for laminating multiple layers of printed circuit board (PCB). Multilayer PCB is an entirely different technology from multilayer thin film in accordance with the invention. Thin film packaging is used for fine pitch, high density MCM packaging with Cu polyimide construction. PCB is low density using pre-preg epoxy resin. The two technologies have different application ranges and process methods. Moreover a large (greater than 25 $\mu$m) surface non planarity is observed in a PCB structure.

U.S. Pat. No. 5,633,072 discloses adhesion and void filling in a PCB process. PCB lamination and gap filling are for systems with low wiring density of over 50 $\mu$m wide lines and are operated at low temperature of less than 100° C. but high pressure of more than 2000 psi due to the large pre-preg grain in the material used. The present invention is for Cu/polyimide thin film which requires low pressure of less than 150 psi and high temperature of higher than 350° C. due to the fine line pitch of 10 $\mu$m –50 $\mu$m and stable material (450° C.).

U.S. Pat. No. 5,043,221 describes a material invention and its application to PCB. Materials used in PCB process have different properties and requirements than those used for thin film process, as the two technologies differ in processing condition and sequence.

U.S. Pat. No. 4,894,271 describes a method for PCB manufacturing. The materials used and the process conditions described in this patent are not applicable to the invention, because the invention is directed to thin film interconnect lamination and planarization at the scale of less than 15$\mu$m topography by 10$\mu$m wiring density which is not achievable by low density PCB technology.

U.S. Pat. No. 5,672,226 describes a method and structure in PCB processing. The material used and the process condition in this patent are not compatible with thin film process which uses Cu-polyimide construction that the invention is based on.

U.S. Pat. No. 5,679,444 describes a method for multilayer PCB construction. The process described can enhance PCB wireability by stacking multiple PCB sheets together with adhesives. PCB technology is a low density wiring technology, while the invention is directed to multilayer thin film process and planarization.

U.S. Pat. No. 5,741,575 describes an adhesive used for PCB layers adhesion. PCB processes at 200° C. and below. The material used for PCB is not relevant to the invention, because the temperature of thin film process reaches up to 400° C. and only polyimide material and adhesive work at such high temperature.

U.S. Pat. No. 5,637,382 describes a method of forming a free standing, flexible Cu-polyimide-Cu composite in thickness of 10 $\mu$m or less. While the materials used in this patent and id their scale are similar to those used in the invention, this patent relates to the making of the flexible composite and the circuitry made by said composite. The invention, however, is directed to thin film circuitry with multiple layers of Cu-polyimide stacks and the method of planarizing the surface topography of such stacking.

Therefore, none of the cited patents address the top surface planarity of thin film module covered by this invention.

SUMMARY OF THE INVENTION

It is an object of the present invention to provide a method for planarizing the dielectric layers in a multi-level thin film structure. The method in accordance with the invention is extendable to large format processing.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1A:
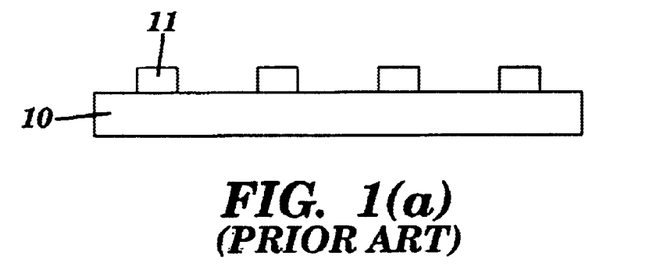
FIGS. 1(a)–1(d) are schematic diagrams showing a conventional method for making multilayer thin film using spin coating, which would result in up to 40% surface topography variation.
Figure 1B:
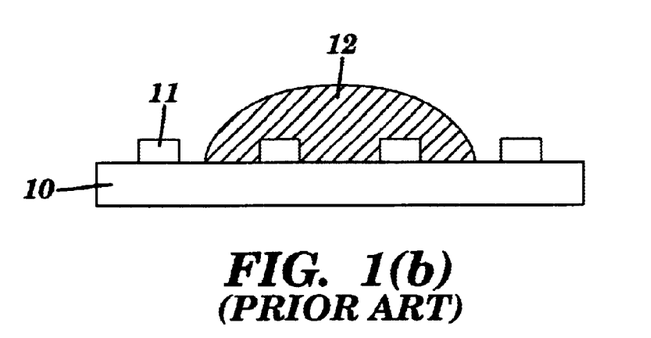
Figure 1C:
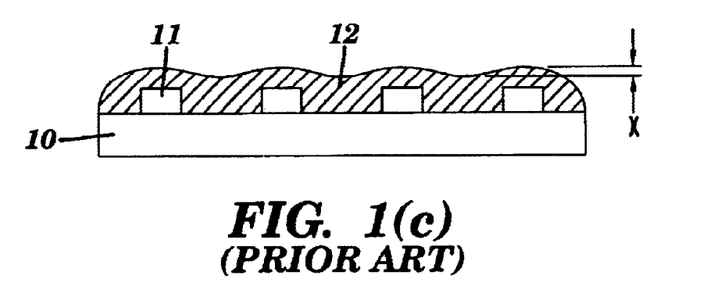
Figure 1D:
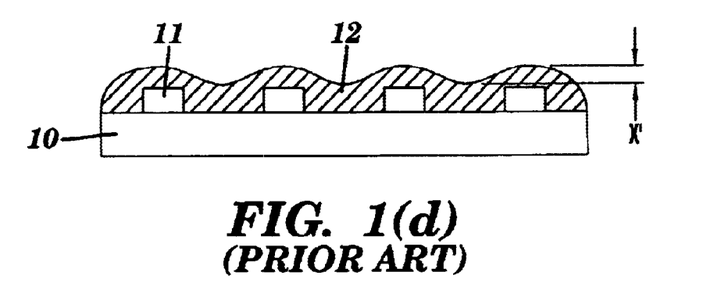

In FIGS. 1(a)–1(d), there is provided schematic diagrams showing a conventional method for making multilayer thin film structures using spin coating. FIG. 1(a) shows a thin film structure with at least one polyimide dielectric layer 10 and at least one layer of metal wiring features 11. The at least one polyimide dielectric layer 10 is typically formed on a substrate (not shown) made of glass, silicon or other suitable material. A polyimide dielectric overcoat 12 is applied to the thin film structure, as shown in FIG. 1(b). The polyimide overcoat is then spin coated on the structure, as shown in FIG. 1(c), typically at about 2000 revolutions per minute (RPM) to about 3000 RPM. Following spin coating, the polyimide overcoat may have a topographic surface variation of as much as 10%, indicated by x in FIG. 1(c). The polyimide overcoat is then cured, as shown in FIG. 1(d). Following cure, the polyimide overcoat may have a topographic surface variation of as much as 40%, indicated by X' in FIG. 1(d).

Referring to FIGS. 2 to 4, there are provided schematic diagrams of inventive methods of making multilayer thin film lamination and surface planarization. A multilayer thin film interconnect packaging typically has over 3 layers of Cu wiring with polyimide dielectric in between. A typical Cu wiring layer is about 5 $\mu$m in thickness and the polyimide dielectric is about 7 $\mu$m in thickness. Because of the Cu metal wiring structure, the polyimide dielectric overcoat conforms to the metal topography. For each layer of metal, the surface topography is about 2–3 $\mu$m. Therefore, after over 3 layers of thin film stacks, the top surface of the structure has as much as 15 $\mu$m topographic surface variation depending on the Cu wiring layers below. The line width of a multilayer thin film wiring is typically between 10 to 50 $\mu$m. This is a very unique process region. A typical back-end-of-line (BEOL) wiring of a chip is typically in sub-microns and serves to connect gates within the chip. Multilayer thin film interconnect is used in multi-chip-module (MCM) to make connection between chips in a C4 configuration. This chip-to-chip connection typically requires 10–50 $\mu$m wide lines with 5 $\mu$m thickness. The lines are further fanned out to printed circuit board (PCB) for 10 connection which uses over 50 $\mu$m Cu lines and over 50 $\mu$m thick dielectric insulator such as FR-4 resin material. Therefore, multilayer thin film interconnect is an entirely different interconnection technology from printed circuit board and thin film serves an entirely different function in packaging. As chip C4 pitch is further reduced, the thin film surface topography needs to be reduced correspondingly in order to be in good contact with the chip surface. This surface topography reduction in thin film is normally accomplished by surface polishing. However, polishing process is expensive and is difficult to extend to large format film processing due to surface variation and rigidity flexing. The invention, however, provides that a planarized surface can be obtained by using lamination which is a low cost alternative to surface polish. In addition, the invention has a unique conforming planarization feature which differs from the rigid planarization by polish.

Figure 2A:
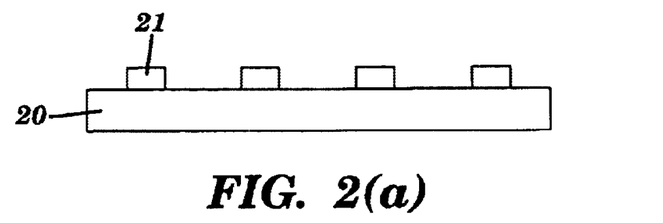
FIGS. 2(a)–2(e) are schematic diagrams depicting a method for making a lamination and surface planarization in accordance with the present invention.
Figure 2B:
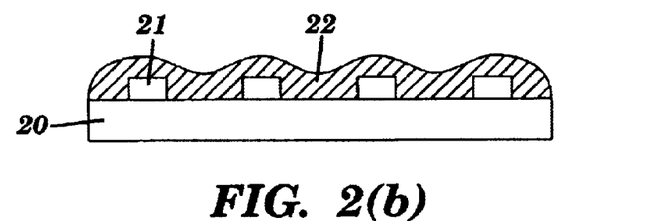
Figure 2C:
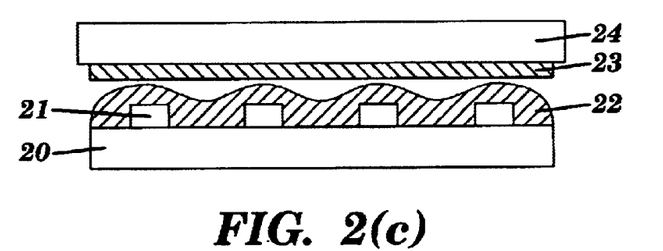
Figure 2D:
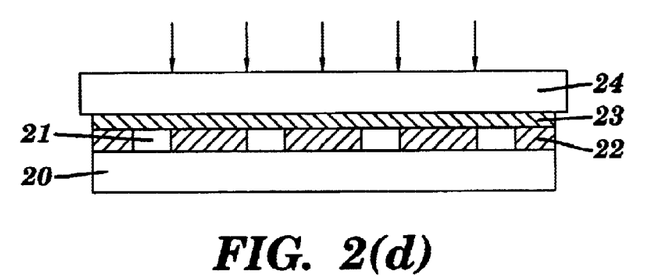
Figure 2E:
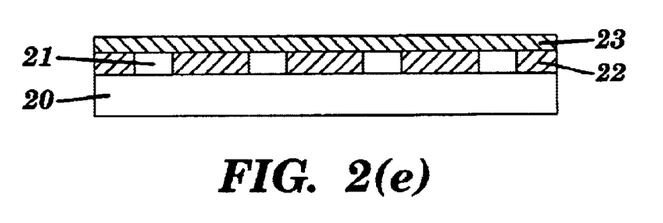

Therefore, the invention relates to a new method and its associated fixtures for thin film dielectric joining and surface planarization. In the invention, as shown in FIGS. 2(a)–2(e), a pre-cured polyimide film 23 with a correct thickness is laminated onto a surface of a thin film surface metal to form a planarized dielectric coating. FIG. 2(a) shows a thin film structure with at least one polyimide dielectric layer 20 and at least one layer of metal wiring features 21. The at least one polyimide dielectric layer 20 may be formed on a substrate (not shown) made of glass, silicon or other suitable material. FIG. 2(b) shows a thin polyimide coating 22 applied to the thin film structure. Polyimide coating 22 may be formed of poly(4,4-oxydiphenylene pyromellitimide) (PMDA-ODA), known as Kapton® and available from DuPont. Kapton KJ is particularly suitable for this polyimide coating 22. In FIG. 2(c), a thin polyimide film 23 is applied to the thin film structure with coating 22.(This polyimide lamination film 23 can be a pre-cut stand-alone film, such as Kapton HN or VN films by DuPont, or can be a polyimide such as BPDA-PDA spun coated onto a glass cover plate 24 and cured. A thin adhesive material 22 is used to join the lamination film 23 to the thin film surface metallurgy 21. Preferably, this thin adhesive material 22 gives a thin polyimide coating layer to ensure high temperature compatibility as well as its processability. The process for such thin polyimide adhesive coating 22 is to dispense the adhesive in a liquid form onto the metal surface and bake to dry. Then the thin polyimide lamination film 23, with glass cover 24 as backing, is carefully placed on the polyimide adhesive 22. Heat and pressure are used in a synchronized format to cure the assembly properly, as shown in FIG. 2(d). This is called a synchronized temperature and pressure curing bake. Since the cured polyimide lamination film 23 does not deform during the synchronized curing, the adhesive material 22 is forced to fill in the topographic valley areas in the metal base with the polyimide lamination film 23 on the top of the metal 21 and in the high surface areas. The glass cover plate 24 is released after the assembly is cured, as shown in FIG. 2(e). Since the glass cover plate 24 has a smooth surface, the top surface of the polyimide lamination film 23 after release conforms to the surface of the glass cover 24. Therefore, it accomplishes naturally a planarized surface. All the topographic troughs and valleys in the metal 21 are now filled with the adhesive material by the pressure and cure. In this way, a large range of surface topography can be planarized and the planarization is controlled by the surface planarity of the glass cover. The thickness of the dielectric coating 23, which is pre-selected and is pre-cured prior to the lamination, dictates the final coating thickness.

In accordance with a preferred embodiment of the invention, as shown in FIGS. 2(a)–2(e), a planarization method uses a separate pre-cut or pre-cured film 23 laminated onto a metallized surface to form planarized dielectric coating. The surface planarization is achieved by forced conforming of the dielectric surface to the flat glass cover surface under a synchronized heat and pressure curing process, as shown in FIG. 2(d). The adhesion between the top surface of the thin film structure and the lamination film 23 is achieved by using a thin layer of polyimide adhesive 22, such as DuPont Kapton KJ.

As is shown in FIG. 2(b), the polyimide adhesive 22 is first dispensed in liquid form to the surface of the thin film metal surface and baked. The thin lamination film 23 with the cover glass 24 as backing is then carefully placed on the top of the polyimide adhesive 22, as shown in FIG. 2(c). The uniformity of the adhesive coating 22 is controlled by glassplate surface under heat and pressure. Similarly, the uniformity of the adhesive coating 22 is controlled by viscosity of the liquid and by the spin coating process and its thickness is determined by that of RPM.

Figure 5A:
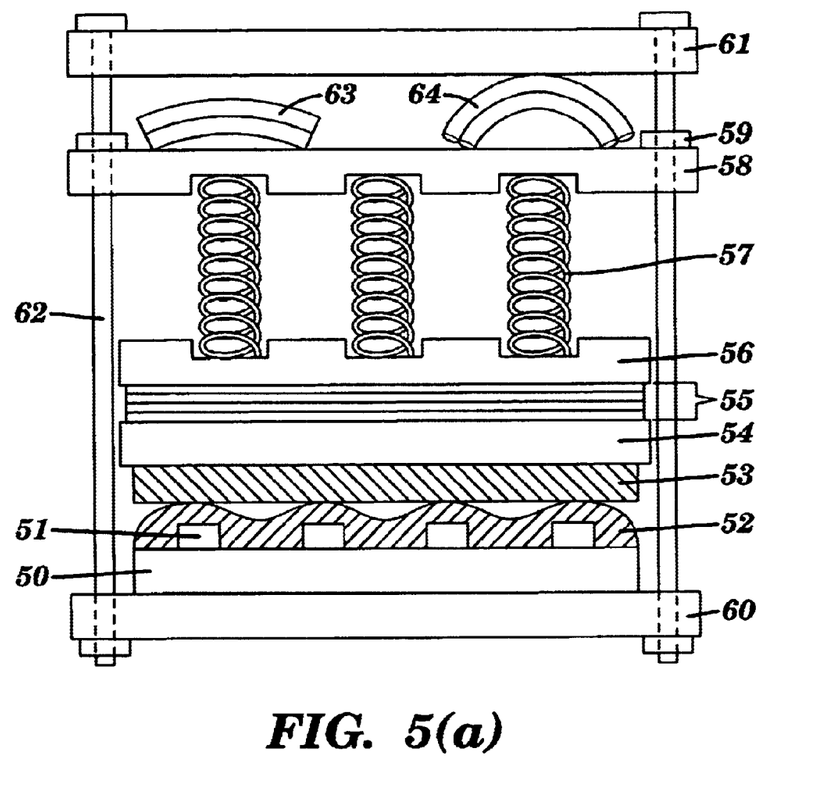
FIG. 5(a) is a schematic diagram of the lamination device for synchronized pressure and temperature bake.
Figure 5B:
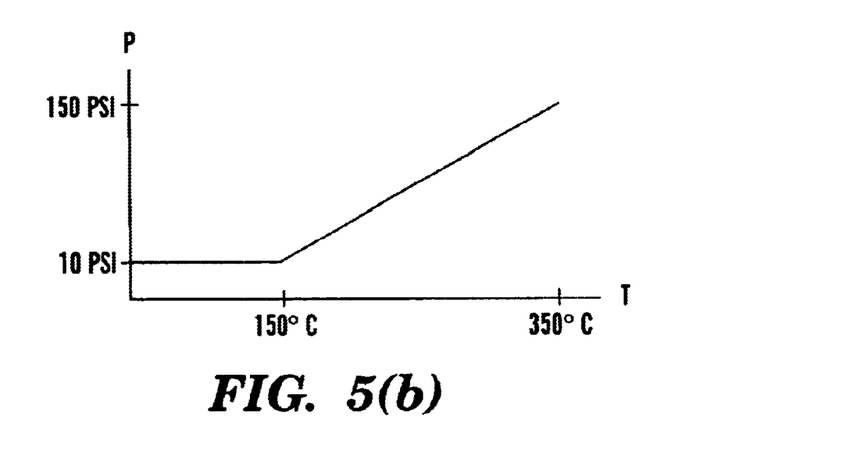
FIG. 5(b) is a graph showing pressure as a function of temperature in the lamination device of FIG. 5(a).

The assembly is then heated under pressure and cured, as shown in FIG. 2(d). The heat and the pressure should be applied in a correlated format. FIGS. 5(a)–5(b) show such a schematic. In accordance with a preferred embodiment of the invention, when the lamination temperature ranges between about 100° C. and about 350° C., the lamination pressure is between about 10 psi and about 150 psi, as shown in FIG. 5(b). If the pressure is applied too low for a given temperature, then the polyimide adhesive delaminates. If the pressure is applied too high for a given temperature, there is air entrapment. Only with a correct temperature-pressure regimen does the polyimide adhesive 22 conform to a uniform thin coating between the thin film metal 21 and the lamination film 23. Further, the baking fixture has an array of springs to ensure uniform pressure coverage on the plates, as shown in FIG. 5(a). The array of springs comprises bi-metal springs attached to the end so that the pressure on the assembly increases as the joining temperature increases.

The topography in the surface valley areas and gaps around the metal base are also filled with adhesive material by the lamination pressure. After the assembly is cured, the cover glass 24 is released by using a UV laser irradiation process, such as the process described in U.S. Pat. No. 5,258,236, to reveal the planarized dielectric surface, as shown in FIG. 2(e). The top surface topography is controlled by the glass cover 24 to achieve the desired planarization.

As is shown in FIGS. 2 to 4, the invention herein can take on a number of embodiments including the preferred embodiment, as stated in the following:

1. A thin film interconnect module is provided with a polyimide adhesive laminated with a pre-cured polyimide lamination film on the top of the polyimide adhesive. The polyimide lamination film is covered with a glass plate.

2. If the polyimide adhesive is in liquid form, the assembly is spun at an appropriate RPM of 2000 to 3000 to obtain required thickness for the adhesive.

3. Pressure of between about 10 psi and about 100 psi, and heat of between about 100° C. and about 350° C. are applied in a synchronized format to ensure uniform curing for the adhesive layer.

4. If the adhesive is in a dry form, appropriate pressure of about 100 psi is applied to obtain adhesion.

6. The curing fixture for the synchronized bake in (3) comprises two types of springs. The first type of springs is of Inconel grade nickel alloy for high temperature operation. The first springs are distributed in a square array over the active area in such a way that uniform pressure is obtained. The second type of springs is attached to the first type of spring, and the second springs are bi-metal in construction. To this type of springs additional pressure is applied as the bake temperature is raised. (See FIG. 5(a).)

7. If the thin film interconnection itself is on a glass carrier, laser can be used to release the carrier, while the cover glass is still in place. This "flip-flop" operation allows the planarization of both top and bottom surfaces of the thin film structure.

FIGS. 1(a)–1(d) represent a prior art process in which normal polyimide like BPDA-PDA or PMDA-ODA does not reflow to fill gaps once cured.

FIGS. 2(a)–2(e) shows current invention using pre-cut BPDA-PDA and Kapton KJ adhesive.

Figure 3A:
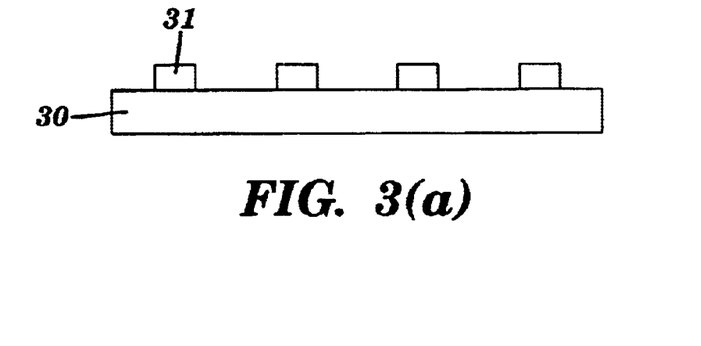
FIGS. 3(a)–3(d) are schematic diagrams showing one of the preferred embodiments using a polyimide such as Kapton KJ only to fill gaps under heat and pressr.
Figure 3B:
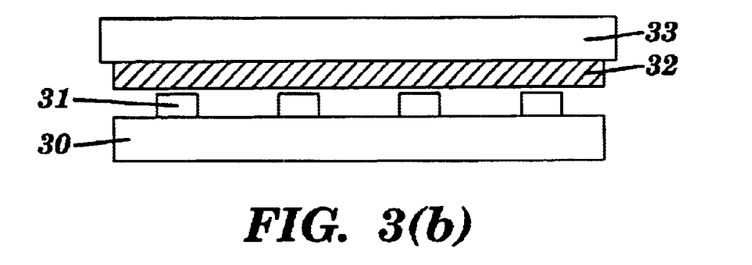
Figure 3C:
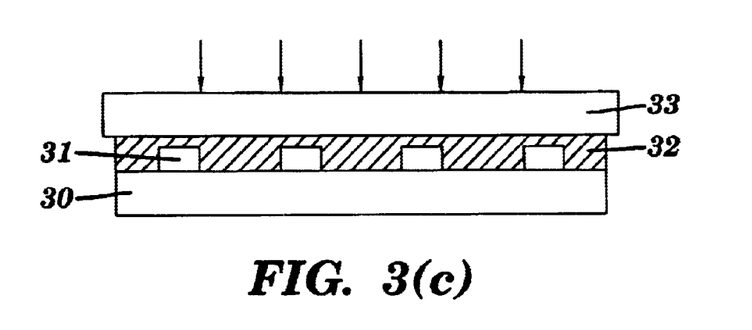
Figure 3D:
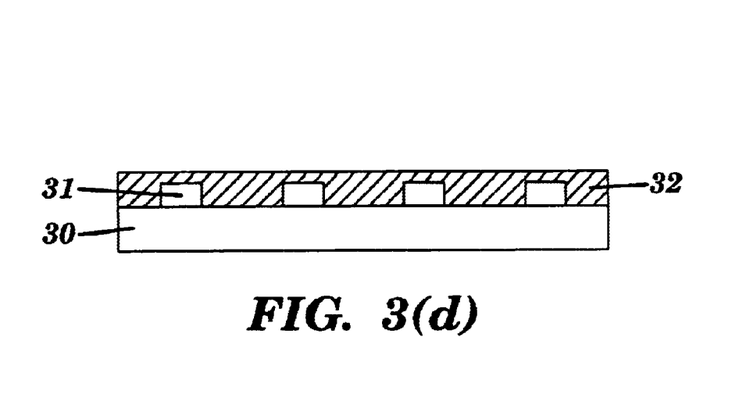

FIGS. 3(a)–3(d) show a process in which DuPont Kapton KJ adhesive reflows and fills gaps under heat and pressure. This practice is sometime acceptable. FIG. 3(a) shows a thin film structure with at least one layer of metal wiring features 31 and at least one polyimide dielectric layer 30. In FIG. 3(b), a thick polyimide film 32, such as a Kapton KJ film having a thickness of about 1 mil, which has been applied to a glass plate 33, is carefully placed on the top of the thin film structure. The thin film structure, polyimide film 32 and glass plate 33 are then laminated, preferably at a temperature of about 350° C. and a pressure of about 100 psi, as shown in FIG. 3(c). Finally, in FIG. 3(d), the glass plate 33 is released using any suitable method, such as by UV laser irradiation.

Figure 4A:
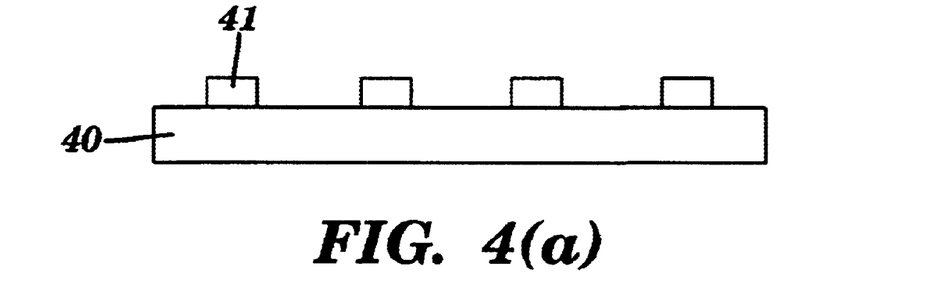
FIGS. 4(a)–4(f) are schematic diagrams showing another preferred embodiment using spin coat pre-cured poly(p-phenylene biphenyltetracarboximide) (BPDA-PDA) with glass plate and lamination under temperature and pressure.
Figure 4B:
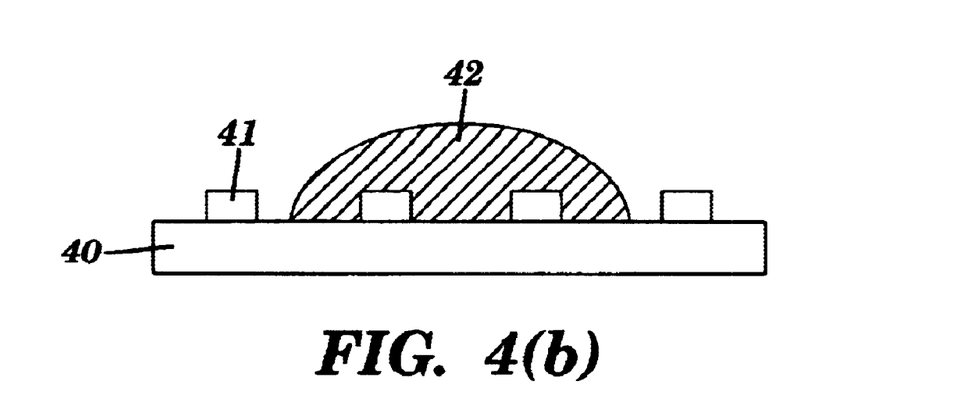
Figure 4C:
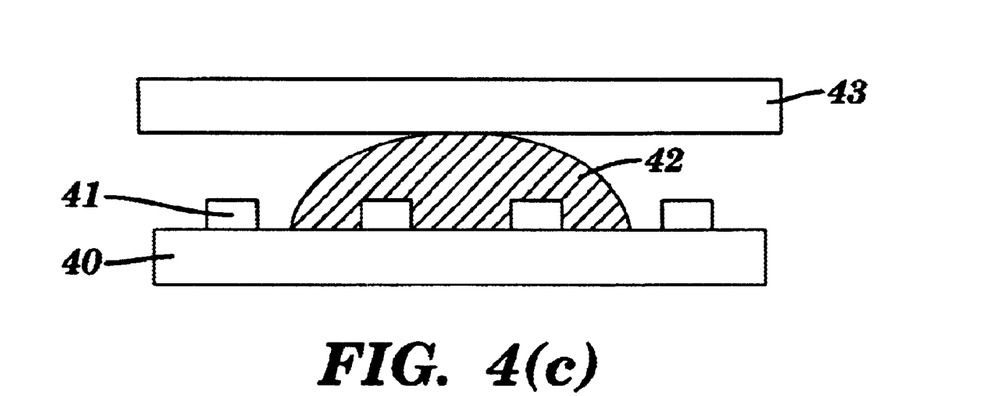
Figure 4D:
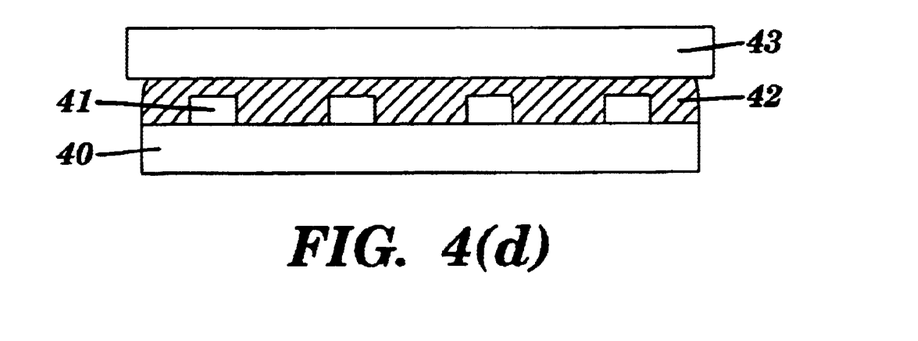
Figure 4E:
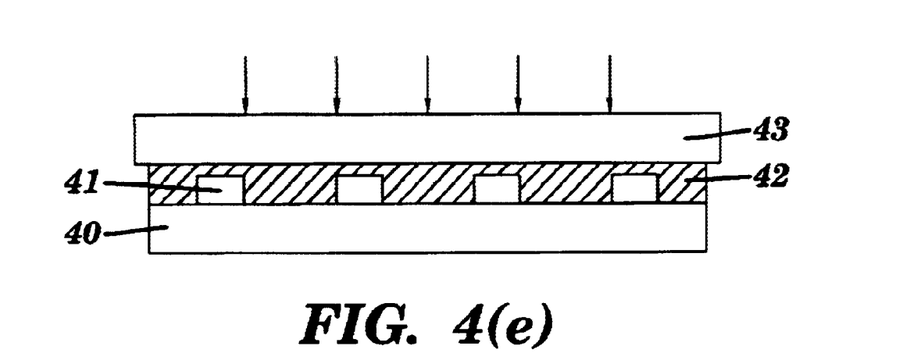
Figure 4F:
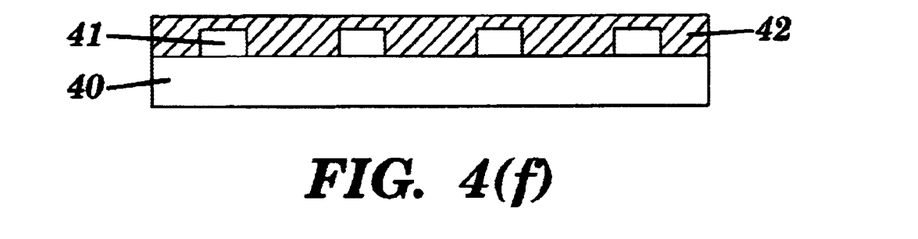

FIGS. 4(a)–4(f) show a process in which BPDA-PDA is coated with glass on and Kapton KJ is not used. BPDA-PDA has to be cured in temperate pressure fixture. FIG. 4(a) shows a thin film substrate with at least one layer of metal wiring features 41 and at least one polyimide dielectric layer 40. In FIG. 4(b), a liquid polyimide such as BPDA-PDA is dispensed onto the thin film structure. A glass plate 43 is carefully placed on top of the liquid polyimide, as shown in FIG. 4(c). The thin film structure with polyimide 42 and glass plate 43 is spun at about 2000 RPM to about 3000 RPM to achieve uniform fill, as shown in FIG. 4(d). The assembly is then laminated, as shown in FIG. 4(e). Finally, the glass plate 43 is removed using any suitable method, such as by UV laser irradiation.

FIG. 5(a) shows a schematic diagram of the lamination device or curing fixture. A polyimide adhesive 52 is applied to a thin film substrate with at least one layer of metal wiring features 51 and at least one polyimide dielectric layer 50 by the method previously described and shown in FIG. 2(b). A pre-cut polyimide film 53, which has been previously applied to a glass plate 54, is placed carefully over the adhesive 52. The entire assembly of thin film substrate, adhesive 52, polyimide film 53 and glass plate 54 is then placed in the lamination device shown in FIG. 5(a). Alternatively, the thin film substrate with adhesive 52 may be placed in the lamination device first, and then the polyimide film 53 and glass plate 54 may be placed on top of the adhesive 52.

The lamination device comprises a base 60, top 61 and vertical support rods 62. A cushion layer 55 and spring base 56 are disposed on top of the glass plate 54. Cushion layer 55, which may be formed of multiple Kapton sheets, provides uniform pressure and prevents deformation of polyimide film 55. Above the spring base 56 are first type of springs 57, which are formed of Inconel grade nickel alloy for high temperature operation and are preferably distributed in a square array over spring base 56. A second type of springs 63 and 64 are located above first springs 57. Springs 63 and 64 are of bi-metal construction. A one-way spring separator 58 separates springs 57 from springs 63 and 64. Spring separator 58 travels up and down along support rods 62, but is prevented from rising above a certain point by stops 59. Springs 57 are preferably pre-loaded at about 10 psi, springs 63 are preferably pre-activated at a temperature of about 100° C. to about 200° C., and springs 64 are preferably activated to increase the pressure to about 150 psi at a temperature of about 350° C. This synchronized pressure/temperature relationship is shown in FIG. 5(b), which depicts a graph of pressure as a function of temperature. A temperatures below about 150° C., the pressure remains relatively constant at about 10 psi. When the temperature is increased from about 150° C. to about 350° C., the pressure is uniformly increased from about 10 psi to about 150 psi.

What is claimed is:

1. A method for forming a planarized surface on a multilayer thin film interconnect structure comprising the steps of:

providing an interconnect structure having at least one layer of metal wiring and at least one layer of polyimide dielectric;

placing a pre-cured polyimide film directly on the at least one layer of metal wiring, without use of an adhesive, wherein the polyimide film is formed on a glass cover plate and cured prior to placing the polyimide film on the interconnect structure;

laminating the glass cover plate, polyimide film, and interconnect structure, thereby forming the planarized surface; and removing the glass cover plate from the laminated polyimide film and interconnect structure.

2. The method of claim 1, wherein the polyimide film comprises poly(p-phenylene biphenyltetracarboximide).

3. The method of claim 1, wherein the polyimide film is a free standing film.

4. The method of claim 1, wherein the polyimide film comprises poly(4,4'-oxydiphenylene pyromellitimnide).

5. The method of claim 1, wherein the glass cover plate is removed using a UV laser irradiation process.

6. The method of claim 1, wherein the polyimnide film and interconnect structure are laminated using synchronized heat and pressure.

7. The method of claim 1, wherein the polyimide film and interconnect structure are laminated at a temperature of about 100° C. to about 350° C. and at a pressure of about 10 psi to about 150 psi.

8. A method for forming a planarized surface on a multilayer thin film interconnect structure comprising the steps of:

providing an interconnect structure having at least one layer of metal wiring and at least one layer of polyinide dielectric;

applying a polyimide adhesive on the at least one layer of metal wiring;

placing a pre-cured polyimide film on the at least one layer of metal wining, wherein the polyimide film is formed on a glass cover plate and cured prior to placing the polyimide film on the interconnect structure;

laminating the glass cover plate, polyimide film and interconnect structure, thereby forming the planarized surface; and removing the glass cover plate from the laminated polyimide film and interconnect structure.

9. The method of claim 8, wherein the polyimide adhesive comprises poly(4,4'-oxydiphenylene pyromellitimide).

10. The method of claim 8, wherein the step of applying a polyimide adhesive comprises dispensing the adhesive in liquid form onto the interconnect structure surface.

11. The method of claim 10, wherein the step of applying a polyimide adhesive further comprises spinning the adhesive and interconnect structure at about 2000 RPM to about 3000 RPM.

* * * * *